(12) United States Patent
Tuominen et al.

(10) Patent No.: US 11,452,212 B2
(45) Date of Patent: Sep. 20, 2022

(54) COMPONENT CARRIER WITH ELECTRICALLY CONDUCTIVE LAYER STRUCTURES HAVING WINDOWS DEFINED BY A CONFORMAL MASK AND TAPERING AT LEAST PARTIALLY

(71) Applicant: AT&S (China) Co. Ltd., Shanghai (CN)

(72) Inventors: Mikael Tuominen, Pernio (FI); Seok Kim Tay, Singapore (SG); Sally Sun, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 11 days.

(21) Appl. No.: 16/949,203

(22) Filed: Oct. 20, 2020

(65) Prior Publication Data
US 2021/0127496 A1 Apr. 29, 2021

(30) Foreign Application Priority Data
Oct. 23, 2019 (CN) .......................... 201921792173.6

(51) Int. Cl.
*H05K 1/11* (2006.01)
*H05K 3/00* (2006.01)
*H05K 3/42* (2006.01)
*H05K 1/18* (2006.01)

(52) U.S. Cl.
CPC .......... *H05K 3/0032* (2013.01); *H05K 1/115* (2013.01); *H05K 3/0094* (2013.01); *H05K 3/427* (2013.01); *H05K 1/185* (2013.01); *H05K 2201/09827* (2013.01); *H05K 2201/09854* (2013.01); *H05K 2203/0723* (2013.01); *H05K 2203/107* (2013.01); *H05K 2203/1476* (2013.01)

(58) Field of Classification Search
CPC ...................................... H05K 1/115
USPC .......................................... 174/260
See application file for complete search history.

(56) References Cited

U.S. PATENT DOCUMENTS

| | | | |
|---|---|---|---|
| 6,119,338 A | 9/2000 | Wang et al. | |
| 10,779,407 B1* | 9/2020 | Chen | H05K 1/114 |
| 2005/0110021 A1* | 5/2005 | Park | H01L 27/3246 257/72 |
| 2010/0307809 A1 | 12/2010 | Noda et al. | |

(Continued)

*Primary Examiner* — Stanley Tso
(74) *Attorney, Agent, or Firm* — Robert A. Blaha; Smith Tempel Blaha LLC

(57) ABSTRACT

A component carrier includes an electrically insulating layer structure, a first electrically conductive layer structure, a second electrically conductive layer structure, and a laser through-hole with an electrically conductive medium filling at least part of the through-hole. The first electrically conductive layer structure covers a first side of the electrically insulating layer structure and has a first window extending through the first electrically conductive layer structure formed by etching using a conformal mask. The second electrically conductive layer structure covers an opposed side of the electrically insulating layer structure and has a second window extending through the second electrically conductive layer structure formed by etching using a conformal mask. The laser through-hole extends through the electrically insulating layer structure. At least a portion of at least one sidewall of the electrically conductive layer structures delimiting the windows is tapered.

10 Claims, 3 Drawing Sheets

(56) References Cited

U.S. PATENT DOCUMENTS

| | | | |
|---|---|---|---|
| 2016/0007468 A1* | 1/2016 | Tomikawa | H05K 3/4697 |
| | | | 174/260 |
| 2019/0313524 A1* | 10/2019 | Huang | C03C 17/06 |
| 2020/0006470 A1* | 1/2020 | Chang | B81B 3/0086 |
| 2020/0253052 A1* | 8/2020 | Ifis | H05K 3/427 |
| 2020/0395528 A1* | 12/2020 | Fujii | B41J 2/1646 |
| 2021/0036054 A1* | 2/2021 | Gallagher | H01L 43/08 |

\* cited by examiner

COMPONENT CARRIER WITH ELECTRICALLY CONDUCTIVE LAYER STRUCTURES HAVING WINDOWS DEFINED BY A CONFORMAL MASK AND TAPERING AT LEAST PARTIALLY

CROSS-REFERENCE TO RELATED APPLICATIONS

This application claims the benefit of the filing date of the Chinese Utility Model Application No. 201921792173.6, filed Oct. 23, 2019, the disclosure of which is hereby incorporated herein by reference.

TECHNICAL FIELD

A component carrier with conformal mask defined electrically conductive layer structures.

BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently contact electrically conductive layer structures with proper quality. Formation of vias, which may be copper filled, may be advantageous for this and other purposes.

SUMMARY

There may be a need for a component carrier allowing to efficiently contact electrically conductive layer structures with proper quality.

According to an embodiment of the invention, a component carrier is provided, wherein the component carrier comprises an electrically insulating layer structure, a first electrically conductive layer structure covering a front side of the electrically insulating layer structure and having a first window extending through the first electrically conductive layer structure formed by etching using a conformal mask, a second electrically conductive layer structure covering a back side of the electrically insulating layer structure and having a second window extending through the second electrically conductive layer structure formed by etching using a conformal mask, a laser through-hole extending through the electrically insulating layer structure, and an electrically conductive filling medium filling at least a part of the laser through-hole, wherein at least a portion of at least one sidewall of the electrically conductive layer structures delimiting the windows is tapering.

According to another embodiment of the invention, a method of manufacturing a component carrier is disclosed, wherein the method comprises forming a first window extending through a first electrically conductive layer structure covering a front side of an electrically insulating layer structure by etching using a conformal mask, forming a second window extending through a second electrically conductive layer structure covering a back side of the electrically insulating layer structure by etching using a further conformal mask, forming a laser through-hole extending through the electrically insulating layer structure, and filling at least a part of the laser through-hole with an electrically conductive filling medium, wherein at least a portion of at least one sidewall of the electrically conductive layer structures delimiting the windows is tapering.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "stack" may particularly denote an arrangement of multiple planar layer structures which are mounted in parallel on top of one another.

In the context of the present application, the term "laser through hole" may particularly denote a hole extending completely through an entire electrically insulating layer structure, and which may be formed by laser processing. Such a through hole may have, for example, two opposing tapering portions extending from the two opposing main surfaces of the electrically insulating layer structure and connecting in a central portion of the electrically insulating layer structure to thereby form a narrower portion here. A laser through hole may be manufactured for instance by a combination of laser shots from the front side and the back side, i.e. from the two opposing main surfaces, of the layer structure. One or more laser shots may be carried out from each of these sides. Formation of a through hole by laser processing from only one main surface may be possible as well.

In the context of the present application, the term "window" may particularly denote a through hole, in particular a circular or a noncircular through hole, extending through an electrically conductive layer structure as a result of a treatment of this electrically conductive layer structure. Descriptively speaking, an etchant may remove material of the electrically conductive layer structure in the region of the window.

In the context of the present application, the term "electrically conductive filling medium" may particularly denote a metal, for instance copper, filling at least part of the via. The electrically conductive filling may be formed by one or more filling procedures, such as electroless deposition, one or multiple plating procedures, etc.

According to an embodiment of the invention, a component carrier is provided which has windows in electrically conductive layer structures above and below a laser through hole extending through an electrically insulating layer structure (such as a core). Advantageously, the windows may be formed by etching. Thus, a laser through hole is formed in combination with conformal mask technology. Advantageously, conformal mask technology for window definition may be implemented in combination with a formation of a laser through hole. Obtainable advantages are significant improvements in the following areas:

via size tolerance control;
overhang control;
high via density core production; and
provision of a component carrier meeting even demanding specifications and higher via density.

Moreover, sidewalls of the first electrically conductive layer structure delimiting the first window may have a negative or positive taper profile created by a chemical etching process. Correspondingly, sidewalls of the second electrically conductive layer structure delimiting the second window may have a negative or positive taper profile created by the chemical etching process. Thus, at least a portion of at least one sidewall of the electrically conductive layer structures delimiting the windows may be tapering, in particular towards the electrically insulating layer structure.

Next, further exemplary embodiments of the component carrier and the method will be explained.

In an embodiment, sidewalls of the first electrically conductive layer structure delimiting the first window and sidewalls of the second electrically conductive layer structure delimiting the second window are tapered inwardly towards the electrically insulating layer structure with the laser through hole. When forming said windows by etching, a deviation of the etching process from an ideal anisotropic behavior may result in slanted sidewalls of the electrically conductive layer structures delimiting the windows.

In an embodiment, a lateral overhang of at least one of the first electrically conductive layer structure and the second electrically conductive layer structure beyond a side wall of the electrically insulating layer structure delimiting the laser through hole is less than 5 µm. In the context of the present application, the term "overhang" may particularly denote a partial length of a respective one of the electrically conductive layer structures directly adjacent to the respective window over which partial length the electrically conductive layer structure extends laterally beyond (or hangs freely in a cantilever fashion) over the electrically insulating layer structure. Thus, the overhanging material of the respective electrically conductive layer structure may be locally not supported by material of the electrically insulating layer structure along the extension of the overhang due to the presence of a portion of the through hole in a pocket below the overhanging electrically conductive layer structure. What concerns the above statement that overhanging material may be locally not supported, it should be said that the overhang may relate to the substantially resin free area beneath the respective electrically conductive layer structure. However, a person skilled in the art will understand that some residue resin might be even present within a gap relating to the overhang. In order to quantitatively determine or measure the value of the overhang, the length of the substantially resin-free (wherein resin may refer to the electrically insulating layer structure) undercut directly under an overhanging electrically conductive layer structure may be measured (in particular even if it is not the most receding point or total relief below the overhanging electrically conductive layer structure, for example copper layer).

In other words, for measuring the overhang, the undercut directly below the electrically conductive layer structure may be measured.

In an embodiment, the electrically insulating layer structure is a core. Such a core may in particular comprise fully cured dielectric material, for instance FR4.

In an embodiment, a component is embedded in the stack. In the context of the present application, the term "component" may particularly denote any inlay to be integrated in a cavity of a component carrier stack. Said inlay may fulfill an electric function and can be connected to one or more electrically conductive layer structures of the stack by one or more pads of the inlay. An embedded component may increase the functionality of the component carrier.

In an embodiment, at least a part of the laser through hole is substantially X-shaped. A substantially X-shaped laser through hole may be formed by a first laser drilling from a front side comprising one laser shot, and a subsequent second laser drilling from a back side of the stack comprising one further laser shot. For a thinner electrically insulating layer structure, such a manufacturing process may result in an X-shape of the laser through hole.

In another embodiment, at least a part of the laser through holes has a central substantially cylindrical section between two opposing tapering sections. Such a laser through hole may be formed by a first laser drilling from a front side comprising one laser shot, and by a second laser drilling from a back side comprising two laser shots. For a thicker electrically insulating layer structure, the described manufacturing process may result in two exterior tapering portions of the laser through hole connected by a straight central portion of the laser through hole.

In an embodiment, forming the respective window comprises covering the respective electrically conductive layer structure with a sacrificial layer (such as a photoresist, a photo-imageable material, etc.), irradiating the sacrificial layer with a patterned beam of electromagnetic radiation (wherein the patterning may be accomplished by a mask), and removing selectively only the irradiated or only the non-irradiated sections of the sacrificial layer. Furthermore, it is possible to selectively etch away exposed material of the respective electrically conductive layer structure. By taking this measure, window patterning by a conformal mask may be accomplished.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF EXEMPLARY EMBODIMENTS

Figure 1:
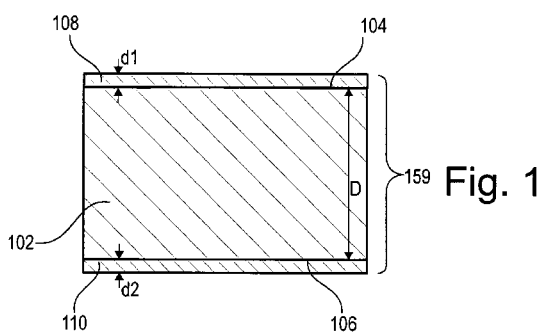
FIG. 1, FIG. 2, FIG. 3, FIG. 4 and FIG. 5 illustrate cross-sectional views of structures obtained during carrying out methods of manufacturing a component carrier with a plated laser through hole, shown in FIG. 6, by a multiple laser shot treatment from opposing sides and by subsequent procedures of filling the laser through hole with electrically conductive material according to an exemplary embodiment.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment may not be elucidated again at a later position of the description.

Further, spatially relative terms, such as "front" and "back", "above" and "below", "left" and "right", et cetera are used to describe an element's relationship to other element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the invention can assume orientations different from those illustrated in the figures when in use.

Before, referring to the drawings, exemplary embodiments will be described in further detail, some basic considerations will be summarized based on which exemplary embodiments of the invention have been developed.

According to an exemplary embodiment of the invention, laser through hole formation may be combined with conformal mask technology used for patterning electrically conductive layers on top and on bottom of an electrically insulating layer structure through which the laser through hole extends.

Conventionally, laser through hole vias are formed by laser direct drilling technology. However, the continued trend of ever tighter via tolerance requirements and higher densities makes it difficult or in some cases impossible to comply with by a laser direct drilling laser through hole process. Some of the key capability items that are edge of laser direct drilling capabilities include:

via diameter tolerances;
overhang specifications;
high laser via quantity designs.

Based on the challenges faced with traditional a laser direct drilling laser through hole via creation process, an embodiment of the present invention realizes a laser through hole via with conformal mask technology. According to an embodiment of the invention, the implemented conformal mask technology provides several benefits:

improved via dimension tolerance stability;
improved overhang capability;
reduced core warpage on the ultra-high-density designs.

FIG. 1 to FIG. 5 illustrate cross-sectional views of structures obtained during carrying out methods of manufacturing a component carrier 100 with a laser through hole 112 by a multiple laser shot treatment from opposing sides according to an exemplary embodiment of the invention. FIG. 6 shows the correspondingly formed component carrier 100 after filling the laser through hole 112 with electrically conductive filling medium 126, preferably copper.

Referring to FIG. 1, an electrically insulating layer structure 102 is covered on both opposing main surfaces 104, 106 thereof with a respective electrically conductive layer structure 108, 110. Layer structures 102, 108, 110 form a stack 159.

Thus, an electrically insulating layer structure 102 is provided which can comprise resin (such as epoxy resin) and optionally reinforcing particles such as glass fibers or glass spheres. The electrically insulating layer structure 102 may for instance be made of fully cured FR4 material, i.e. material having resin which substantially is already completely cross-linked and is not capable of re-melting or becoming flowable by the application of mechanical pressure and/or heat. The first main surface 104 on the front side of the electrically insulating layer structure 102 is covered by first electrically conductive layer structure 108, which may be a metal layer such as a copper foil. The opposing second main surface 106 on the back side of the electrically insulating layer structure 102 may be covered by second electrically conductive layer structure 110, which may be as well a metal layer such as a copper foil.

A vertical thickness D of the electrically insulating layer structure 102 may be relatively small, for instance may be less than 100 µm (more specifically may be in a range between 40 µm and 60 µm). It has been found that laser through hole formation through such a thin electrically insulating layer structure 102 or core is particularly difficult in terms of reliability issues which may be caused by phenomena such as an excessive overhang 122, see FIG. 3 to FIG. 6. The first electrically conductive layer structure 108 and the second electrically insulating layer structure 110 may be continuous metal layers each having a thickness, d1 and d2, of for instance less than 5 µm, in particular between 2 µm and 4 µm.

Figure 2:
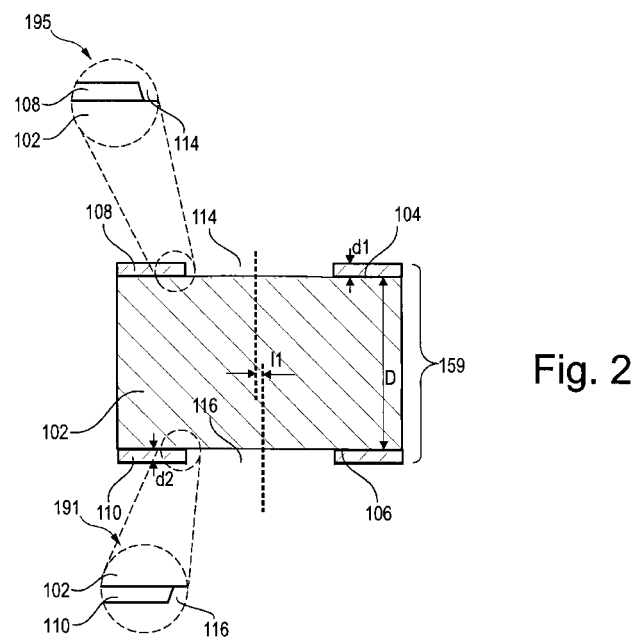

Referring to FIG. 2, the method comprises forming a first window 114 extending through the first electrically conductive layer structure 108 covering the front side 104 of the electrically insulating layer structure 102 by etching using a conformal mask. Furthermore, the method comprises forming a second window 116 extending through the second electrically conductive layer structure 110 covering a back side 106 of the electrically insulating layer structure 102 by etching using a conformal mask. No or substantially no material of the electrically insulating layer structure 102 is removed by the conformal etching process for forming the windows 114, 116. As can be taken from a detail 195 and from a detail 191, sidewalls of the first electrically conductive layer structure 108 delimiting the first window 114 and sidewalls of the second electrically conductive layer structure 110 delimiting the second window 116 are tapering towards the electrically insulating layer structure 102. This is a consequence of the formation of the windows 114, 116 using a conformal mask, since the etching procedure is not fully anisotropic.

FIG. 2 also shows a lateral offset 11 between a center of the first window 114 and a center of the second window 116.

Figure 3:
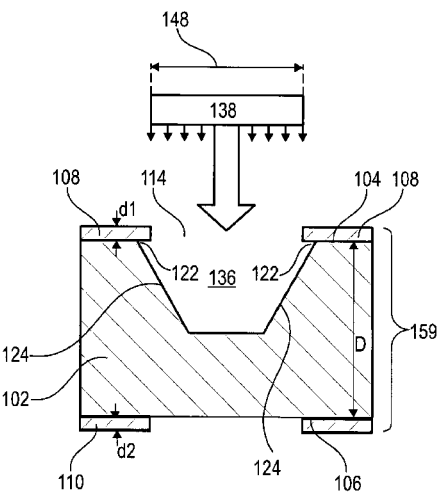

Referring to FIG. 3, a first laser shot corresponding to a first laser beam 138 is directed from the front side 104 onto the exposed electrically insulating layer structure 102. Thus, the exposed portion of the electrically insulating layer structure 102 may be made subject of the first laser drilling through the window 114 and into the electrically insulating layer structure 102 from the front side. As a result, a blind hole 136 is formed in the electrically insulating layer structure 102 in a region adjacent the first main surface 104. The blind hole 136 is delimited by sidewalls 124 of the electrically insulating layer structure 102. This first laser drilling may be carried out using a first laser beam 138 with a diameter or width 148 which is preferably in a range between 65 µm and 120 µm. As a result of the first laser drilling, a lateral overhang indicated schematically with reference numeral 122 can be created as beak-shaped pockets in the blind hole 136. The overhang 122 is located at an interface between the first window 114 formed in the patterned first electrically conductive layer structure 108 and an upper portion of the electrically insulating layer structure 102. Descriptively speaking, the patterned first electrically conductive layer structure 108 with its first window 114 may laterally extend beyond the electrically insulating layer structure 102 by an amount corresponding to the overhang 122.

Figure 4:
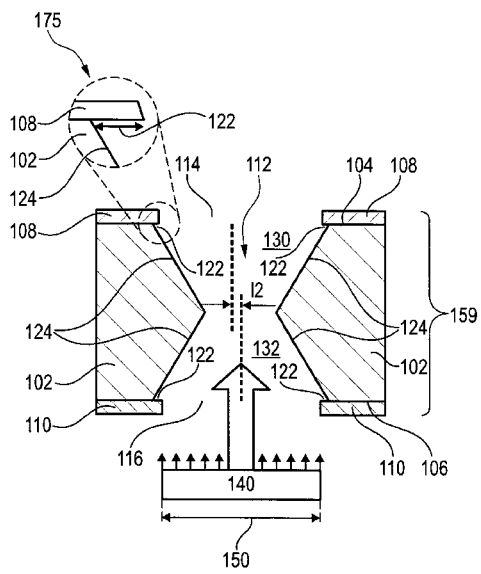

Referring to FIG. 4, a second laser shot may be carried out with a laser source emitting a second laser beam 140 with a width 150 towards the bottom side of the stack 159 for extending through preformed window 116 of the second electrically conductive layer structure 110 and for removing further dielectric material of the electrically insulating layer structure 102 from the bottom side.

Although not shown in the figures, after the process described referring to FIG. 3, the stack 159 may be flipped (i.e. may be turned around by 180°) before carrying out the second laser drilling through the electrically insulating layer structure 102 from the back side or second main surface 106. By taking this measure, it may be prevented that the laser source has to be moved from the top side to the bottom side of the stack 159.

By the second laser shot, additional material of the electrically insulating layer structure 102 may be removed by the second laser shot to extend the blind hole 136 into a laser through hole 112 extending through the entire thickness of the electrically insulating layer structure 102.

As a result of the described manufacturing procedure, a certain overhang 122 may be produced also at an interface between the second electrically conductive layer structure 110 on the one hand and the electrically insulating layer structure 102 on the other hand in the region of the second window 116. The overhang 122 of the first electrically conductive layer structure 108 and the second electrically conductive layer structure 110 beyond the sidewalls 124 of the electrically insulating layer structure 102 delimiting the laser through hole 112 may be preferably not more than 5 µm. A detail 175 shows the overhang 122 for the example of the upper left-hand side of FIG. 4. The corresponding definition of the overhang 122 may be applied also to the upper right-hand side and the lower side of FIG. 4. However, due to the described combination of conformal mask technology for defining windows 114, 116 and laser drilling through electrically insulating layer structure 102, the value of the overhang 122 may be very small, for instance below 5 µm (for example 3 µm).

FIG. 4 illustrates a lateral offset 12 between a center of first tapering section 130 of the laser through-hole 112 in a front side portion of the electrically insulating layer structure 102 and a center of a second tapering section 132 of the laser through-hole 112 in a back side portion of the electrically insulating layer structure 102. Since the windows 114, 116 are formed by etching, whereas the tapering sections 130, 132 are formed by laser drilling, the lateral offset 11 shown in FIG. 2 and the lateral offset 12 shown in FIG. 4 may differ. For instance, the absolute value of the difference between 11 and 12 may be at least 5 µm, in particular at least 10 µm, more particularly at least 20 µm.

After having completed the first laser drilling with one laser shot from the front side (see FIG. 3) and the second laser drilling with only one further laser shot from the back side (see FIG. 4), a substantially X-shaped laser through hole 112 as shown in FIG. 4 may be subsequently filled partially or entirely with electrically conductive filling medium 126 (see FIG. 6). The electrically conductive filling medium 126 may be formed by electroless deposition combined with galvanically plating using the structure shown in FIG. 4 as a starting point. The embodiment of FIG. 4 is particularly advantageous when a simple manufacturing method is desired, since only two laser shots are sufficient to form the substantially X-shaped laser through hole 112.

Figure 5:
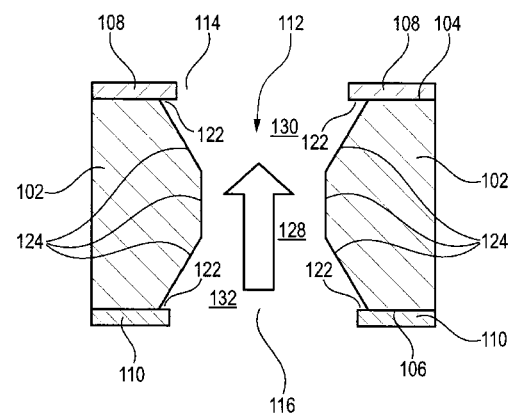
Figure 6:
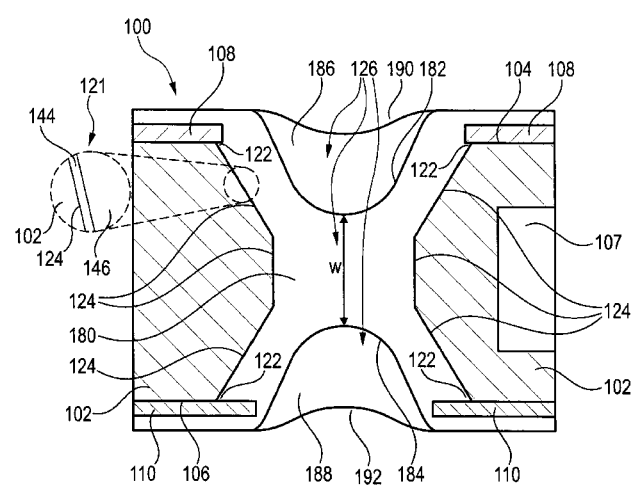

Alternatively, a second laser shot from the bottom side may be carried out resulting in a shape of the laser through hole 112 shown in FIG. 5. Such a structure may be used in an alternative embodiment as a basis for filling the laser through hole 112 with electrically conductive filling medium 126. Formation of a laser through hole 112 with such a geometry will be described below referring to FIG. 5 in further detail.

Referring to FIG. 5, an additional third laser shot (or a second laser shot from the backside) may be executed from the bottom side to further open the middle diameter of the laser through hole 112. Descriptively speaking, the narrowest section of the laser through hole 112 of FIG. 4 may be widened with the third laser shot as shown in FIG. 5. This may contribute to a further improvement of the electric reliability, since it simplifies filling of the laser through hole 112 with electrically conductive filling medium 126. Thus, in the embodiment of FIG. 5, the first laser drilling from the front side (see FIG. 3) comprises or consists of only one laser shot, and the second laser drilling from the back side (see FIG. 4 and FIG. 5) comprises or consists of two laser shots. As a result of the additional third laser shot illustrated in FIG. 5, the obtained laser through hole 112 has a central substantially cylindrical section 128 between the two opposing tapering sections 130, 132.

Thus, the embodiment of FIG. 5 differs from the embodiment of FIG. 4 in that an additional third laser shot is carried out from the backside or second main surface 106. This third laser shot has the effect that the general X-shape shown in FIG. 4 is extended into the shape shown in FIG. 5 with substantially cylindrical central section 128 of the laser through hole 112 connected to two opposing tapering sections 130, 132 on the front side 104 and on the back side 106, respectively.

FIG. 6 illustrates a cross-section of component carrier 100 obtained based on the preform shown in FIG. 5 after filling the laser through hole 112 with electrically conductive filling medium 126. Although the procedure of filling the laser through hole 112 with electrically conductive filling medium 126 will be described below referring to the geometry of the laser through hole 112 shown in FIG. 5, it is alternatively possible to use the X-shaped laser through hole 112 according to FIG. 4 as a basis for this filling procedure in a corresponding way. Hence, it will be described next how the electrically conductive filling medium 126, preferably copper, is formed in the laser through hole 112 shown in FIG. 5.

In order to accomplish this, it is preferable to firstly carry out an electroless deposition procedure to thereby form a thin seed layer 144 of copper directly covering the sidewalls 124 of the electrically insulating layer structure 102 delimiting the laser through hole 112. This can be seen in a detail 121 in FIG. 6. A thickness of the seed layer 144 may be for instance 0.5 µm. However, it is also possible that the seed layer 144 has a thickness above 1 µm and/or that several cumulative seed layers are provided. For example, a thickness of a seed layer or a cumulative thickness of a plurality of seed layers may be in a range between 0.5 µm and 5 µm. When multiple seed layers are provided, they may comprise an organic (for instance polymer) layer, a palladium layer, and/or a copper layer. Formation of the seed layer 144 may promote a subsequent electroplating procedure, as described below.

Subsequently, further electrically conductive material (such as copper) may be deposited on the seed layer 144 by a plating procedure, in particular by electroplating or galvanic plating. Thus, the seed layer 144 on the sidewalls 124 as well as the electrically conductive layer structures 108, 110 may be covered by a plating layer 146 of electrically conductive filling medium 126 such as copper. For instance, the plating layer 146 may have a minimum thickness of 10 µm.

During the described plating procedure of forming plating layer 146, an electrically conductive bridge structure 180 may be integrally formed with the plating layer 146 as a substantially horizontal portion connecting the opposing sidewalls 124 of the laser through hole 112. As shown, the electrically conductive bridge structure 180 is formed to be delimited by a concave upper first demarcation surface 182 oriented upwardly or facing towards the first main surface 104 and by a concave lower second demarcation surface 184 orientated downwardly or facing towards the second main surface 106. Forming the electrically conductive bridge structure 180 may be carried out by galvanic plating together with plating layer 146, preferably following the formation of the seed layer 144. The bridge structure 180 forms a substantially horizontal bridge between the opposing sidewalls 124 of the electrically insulating layer structure 102 delimiting the laser through hole 112 in the narrowest portion of the laser through hole 108.

Preferably, a narrowest vertical thickness w of the bridge structure 180 is at least 20 µm. In particular when the thickness D of the electrically insulating layer structure 102 is relatively small (in particular below 100 µm), a minimum vertical thickness w of the bridge structure 180 of 20 µm ensures proper reliability of the obtained component carrier 100.

Moreover, a first electrically conductive bulk structure 186 filling a major part between the first demarcation surface 182 and the first main surface 104 and a second electrically conductive bulk structure 188 filling a major part between the second demarcation surface 184 and the second main surface 106 are formed. This can be done by carrying out one or more further galvanic plating procedures following the previous plating procedure of forming the bridge structure 180.

Thus, the component carrier 100 according to FIG. 6 can be obtained by carrying out one or more further plating procedures. Thereby, the bulk structures 186, 188, which may for instance consist of copper, can be obtained. In the shown embodiment, a small dip 190, 192, respectively, remains at an upper side or a lower side of the shown component carrier 100. In other embodiments, the bulk structures 186, 188 fill the remaining recesses above the first demarcation surface 182 and below the second demarcation surface 184 almost completely. It should be said that it is well-known by a skilled person that the demarcation surfaces 182, 184 are clearly visible when imaging a cross-section of the component carrier 100.

As shown in FIG. 6, a component 107 (for instance a semiconductor chip) may be embedded in the component carrier 100, in particular in the stack 102.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
    an electrically insulating layer structure;
    a first electrically conductive layer structure covering a front side of the electrically insulating layer structure and having a first window extending through the first electrically conductive layer structure formed by etching using a conformal mask;
    a second electrically conductive layer structure covering a back side of the electrically insulating layer structure and having a second window extending through the second electrically conductive layer structure formed by etching using a conformal mask;

a laser through-hole extending through the electrically insulating layer structure; and an electrically conductive filling medium filling at least a part of the laser through-hole;

wherein at least a portion of at least one sidewall of the electrically conductive layer structures delimiting the windows is tapering, wherein the laser through hole is X-shaped having a lateral offset between a center of the first window and a center of the second window which is different from another lateral offset between a center of a first tapering section of the laser through-hole in a front side portion of the electrically insulating layer structure and a center of a second tapering section of the laser through-hole in a back side portion of the electrically insulating layer structure.

2. The component carrier according to claim 1, wherein a lateral overhang of at least one of the first electrically conductive layer structure and the second electrically conductive layer structure beyond a side wall of the electrically insulating layer structure delimiting the laser through hole is less than 5 µm.

3. The component carrier according to claim 1, wherein the electrically insulating layer structure is a core.

4. The component carrier according to claim 1, wherein a component is embedded in the electrically insulating layer structure.

5. The component carrier according to claim 1, wherein the laser through hole has a central cylindrical section between two opposing tapering sections.

6. The component carrier according to claim 1, wherein sidewalls of the first electrically conductive layer structure delimiting the first window are tapering towards the electrically insulating layer structure.

7. The component carrier according to claim 1, wherein sidewalls of the second electrically conductive layer structure delimiting the second window are tapering towards the electrically insulating layer structure.

8. A method of manufacturing a component carrier, comprising:

forming a first window extending through a first electrically conductive layer structure covering a front side of an electrically insulating layer structure by etching using a conformal mask;

forming a second window extending through a second electrically conductive layer structure covering a back side of the electrically insulating layer structure by etching using a further conformal mask;

forming a laser through-hole extending through the electrically insulating layer structure; and filling at least a part of the laser through-hole with an electrically conductive filling medium, wherein at least a portion of at least one sidewall of the electrically conductive layer structures delimiting the windows is tapering, wherein the laser through hole is X-shaped having a lateral offset between a center of the first window and a center of the second window which is different from another lateral offset between a center of a first tapering section of the laser through-hole in a front side portion of the electrically insulating layer structure and a center of a second tapering section of the laser through-hole in a back side portion of the electrically insulating layer structure.

9. The method according to claim 8, wherein forming the respective window comprises covering the respective electrically conductive layer structure with a sacrificial layer, irradiating the sacrificial layer with a patterned beam of electromagnetic radiation, and removing selectively only the irradiated or only the non-irradiated sections of the sacrificial layer.

10. The method according to claim 9, wherein the method further comprises:

selectively etching away exposed material of the respective electrically conductive layer structure.

* * * * *